(12) United States Patent  
Saulnier et al.

(10) Patent No.: US 7,456,642 B2
(45) Date of Patent: Nov. 25, 2008

(54) HANDHELD ELECTRONIC TEST PROBE ASSEMBLY

(75) Inventors: Christian R. Saulnier, Boutigny (FR); James G. Gasque, Vista, CA (US)

(73) Assignee: Ceramic Component Technologies, Inc., Vista, CA (US)

( * ) Notice: Subject to any disclaimer, the term of this patent is extended or adjusted under 35 U.S.C. 154(b) by 165 days.

(21) Appl. No.: 11/526,539

(22) Filed: Sep. 25, 2006

(65) Prior Publication Data

US 2008/0074125 A1 Mar. 27, 2008

(51) Int. Cl.
*G01R 31/02* (2006.01)
(52) U.S. Cl. ..................................... 324/754
(58) Field of Classification Search ........................ None
See application file for complete search history.

(56) References Cited

U.S. PATENT DOCUMENTS

| | | | | | |
|---|---|---|---|---|---|
| 4,245,189 | A | * | 1/1981 | Wahl et al. | 324/716 |
| 4,518,912 | A | * | 5/1985 | Aslan | 324/95 |
| 4,996,492 | A | * | 2/1991 | Anderson et al. | 324/687 |
| 6,756,798 | B2 | | 6/2004 | Saulnier et al. | |
| 6,957,005 | B2 | | 10/2005 | Saulnier et al. | |
| 7,005,869 | B2 | | 2/2006 | Saulnier et al. | |
| 7,017,435 | B2 | * | 3/2006 | Pooley et al. | 73/866.5 |
| 7,148,712 | B1 | * | 12/2006 | Prey et al. | 324/754 |
| 7,167,011 | B2 | * | 1/2007 | Yang | 324/754 |
| 2003/0001606 | A1 | * | 1/2003 | Bende et al. | 324/762 |
| 2005/0262953 | A1 | * | 12/2005 | Pooley et al. | 73/866.5 |
| 2006/0043959 | A1 | * | 3/2006 | Cavoretto | 324/72.5 |
| 2006/0061348 | A1 | * | 3/2006 | Cannon et al. | 324/72.5 |
| 2007/0241740 | A1 | * | 10/2007 | Hawes | 324/149 |

OTHER PUBLICATIONS

Agilent 16334A Test Fixture Operation and Service Manual; Second Edition; published Dec. 1999 by Agilent Technologies, Agilent Part No. 16334-90000.

* cited by examiner

*Primary Examiner*—Jermele M Hollington
(74) *Attorney, Agent, or Firm*—Loyal McKinley Hanson

(57) ABSTRACT

A test probe assembly includes a probe-supporting component and a test probe on it. According to one aspect of the invention, the probe-supporting component takes the form of a probe-supporting housing in which the test probe is partially disposed so that two test probe legs extend out of the housing to spaced-apart distal end portions of the legs, with the housing enhancing leg stability and limiting leg contact for less stray-impedance influence on test results when a user holds the housing and squeezes the distal end portions toward terminals on a device under test (DUT). According to another aspect, at least one of the distal end portions includes a terminal-contacting electrode having at least two electrically conductive elements for contacting a terminal on the DUT, each electrically conductive element being moveable to and from the terminal independent of the other element for multi-point contact (MPC) purposes resulting in reduced effective serial resistance (ESR) and enabling true Kelvin-type measurements. The legs are preferably composed of a plurality of thin, flat, laser-machined layers, and one alternate embodiment includes at least three terminal-contacting electrodes for use with a three-terminal DUT.

16 Claims, 10 Drawing Sheets

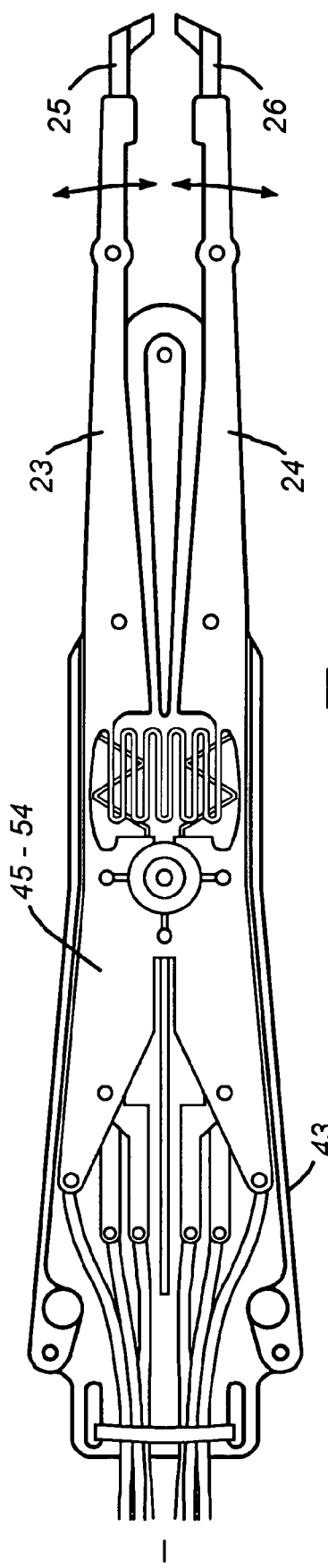
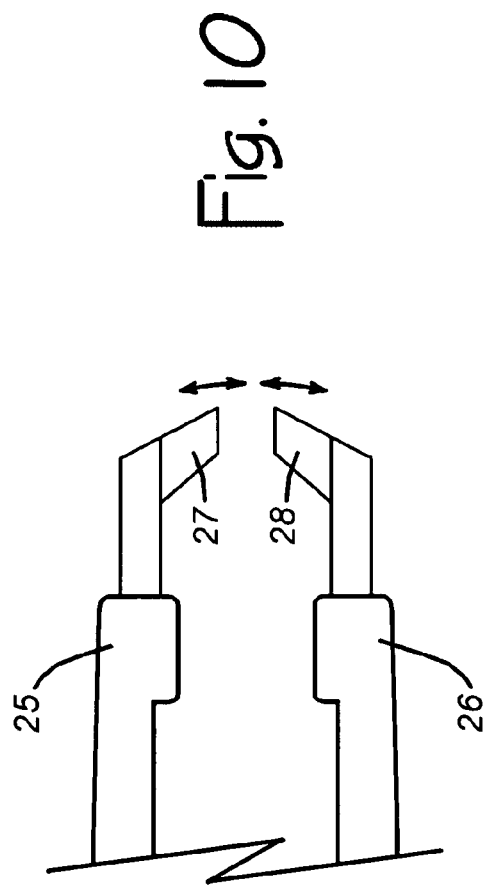
Fig. 9
Fig. 10

HANDHELD ELECTRONIC TEST PROBE ASSEMBLY

BACKGROUND OF THE INVENTION

1. Technical Field

This invention relates generally to the field of electronic test equipment, and more particularly to a handheld electronic test probe assembly for testing miniature electronic circuit components, including passive, ceramic capacitors, resistors, inductors, and the like.

2. Description of Related Art

A typical tweezers is a handheld object used for any of various tasks for which it is designed, including plucking, holding, or manipulating an object. It includes two spring-biased legs having proximal ends that are joined together and opposing distal end portions that are spaced apart. A user grasps the tweezers in one hand and squeezes it in order to move the distal end portions of the legs toward each other so that they bear against an object of interest.

A "tweezers-type" electronic test probe is similar in that it is a handheld object having first and second legs that the user grasps and squeezes. As the user squeezes the legs, electrodes on the distal end portions of the legs come into contact with a device under test (i.e., a DUT). DUTs having parallelepiped shapes with dimensions as small as 0.020 inches by 0.010 inches by 0.010 inches, more or less, are frequently held and tested that way, with electrically conductive lines coupling electrical signals between the electrodes and a test instrument.

Although existing tweezers-type electronic test probes are convenient to use in some respects, they have some accompanying drawbacks. Consider, for example, a typical, commercially available, tweezers-type test probe. Mechanically, the legs are often not very stable. They can move sideways when squeezed together. As a result, the electrodes on the distal ends of the legs move sideways relative to the terminals on a DUT being held, and that movement can adversely affect electrical contact resistance and test results.

In addition, the electrodes of the existing tweezers-type electronic test probe take the form of two, opposing, electrically conductive elements having relatively flat, broad surfaces that bear against the terminals of the DUT. That arrangement results in uncertain contact resistance; it results in an uncertain effective serial resistance (ESR) that adversely affects test results.

Furthermore, an abbreviated Kelvin-type measurement arrangement on the existing tweezers-type electronic test probe disregards the ESR. Separate Kelvin-type sense and drive lines are provided for each electrode, but they do not achieve true Kelvin measurement because both sense and drive lines are connected to the same electrically conductive element so that they are connected together on the test instrument side of the ESR. As a result, drive current flowing through the ESR affects measurements made using the sense lines. Moreover, the entire existing tweezers-type electronic test probe fails to guard against stray serial impedance (SSI) and other stray impedances introduced by the top of a test bench, other nearby objects, and the user's hand gripping the tweezer legs. For these and other concerns that will become more apparent, a need exists for a better handheld electronic test probe assembly.

SUMMARY OF THE INVENTION

This invention addresses the need outlined above by providing an electronic test probe assembly that includes a handheld piece and a combination of components on the handheld piece that function as an electronic test probe. According to one aspect of the invention, the handheld piece (hereinafter referred to as a "probe-supporting component") takes the form of a housing in which the combination of test probe components (hereinafter referred to as a "test probe") is partially disposed. Two test probe legs extend out of the housing to spaced-apart distal end portions of the legs, with the housing enhancing leg stability and limiting leg contact for less stray impedance influence on test results when a user holds the housing and squeezes the distal end portions toward terminals on a device under test (DUT).

According to another aspect of the invention, at least one of the distal end portions of the test probe legs includes a terminal-contacting electrode having at least two electrically conductive elements for contacting a terminal on the DUT. Each electrically conductive element is moveable to and from the terminal independent of the other element to achieve a multi point contact (MPC) resulting in reduced effective serial resistance (ESR) and enabling true Kelvin-type measurements that consider ESR. The legs are preferably composed of a plurality of thin, flat layers that have been laser-machined from sheets of 0.5-millimeter thick material. Preferably, the distal end portions of both legs include such MPC electrodes, and one alternate embodiment includes at least one additional terminal-contacting electrode for use with a three-terminal DUT (a DUT having at least three terminals).

To paraphrase some of the more precise language appearing in the claims and further introduce the nomenclature used, an electronic test probe assembly constructed according to the first aspect of the invention includes: (I) a probe-supporting component in the form of a probe-supporting housing that a user can hold in one hand, and (ii) a test probe disposed partially within the housing. The test probe includes first and second legs that extend distally from the probe-supporting housing to distal end portions of the first and second legs, with the housing limiting contact of the first and second legs by a user when the user holds the housing and squeezes the distal end portions of the first and second legs toward terminals on a DUT.

An electronic test probe assembly constructed according to the second aspect of the invention also includes a probe-supporting component and a test probe on it; the probe-supporting component need not necessarily be a housing. The test probe so supported includes first and second legs that extend distally from the probe-supporting component to distal end portions of the first and second legs, with the distal end portions of the first and second legs including opposing first and second terminal-contacting electrodes for contacting first and second terminals on the DUT. At least the first terminal-contacting electrode includes at least two electrically conductive elements such that each of the two electrically conductive elements is independently moveable; each is moveable towardly and away from the second terminal-contacting electrode independent of the other one of the two electrically conductive elements.

One illustrated embodiment includes a probe-supporting component in the form of a housing, along with two electrically conductive elements on each of both the distal end portions of the first and second legs. The first and second legs are at least partially composed of a plurality of layers and the plurality of layers includes the electrically conductive elements so that they are independently moveable. Each electrically conductive element includes a first end portion held by the housing, a second end portion extending distally beyond the housing, and a spring-biasing mid portion that interconnects the first and second end portions. In addition, the plurality of layers includes electrically conductive guard elements for guarding the electrically conductive elements from stray impedances, a spring element for spring biasing the first and second distal end portions in spaced apart positions, and electrically nonconductive layer for insulating conductive layers from each other. Yet another aspect of the invention provides a third terminal-contacting electrode on one of the first and second test probe legs for use in testing a three-terminal DUT.

Thus, the invention alleviates some drawbacks of existing tweezers-type electronic test probes. It provides true four-wire Kelvin contacts all the way to the surface of the DUT terminals for low impedance applications, and fully guarded, coaxial construction for high impedance applications. The robust, production-worthy construction promises reliability and long life. Parallel, DUT-gripping test probe electrodes significantly reduce the tendency to launch chips. The test probe assembly is suitable for various common chip sizes, and it is ergonomically improved with superior chip pickup and retention that reduces user frustration over lost chips. The above features result in superior electrical and mechanical performance. The following illustrative drawings and detailed description make the foregoing and other objects, features, and advantages of the invention more apparent.

BRIEF DESCRIPTION OF THE DRAWINGS

FIG. 9 is a top plan view of the handheld electronic test probe assembly of the present invention, with a portion of the probe-supporting housing omitted to expose the components within the housing;

FIG. 10 is an enlarged top plan view of just the distal end portions of the first and second test probe legs.

DESCRIPTION OF THE PREFERRED EMBODIMENTS

Figure 1:
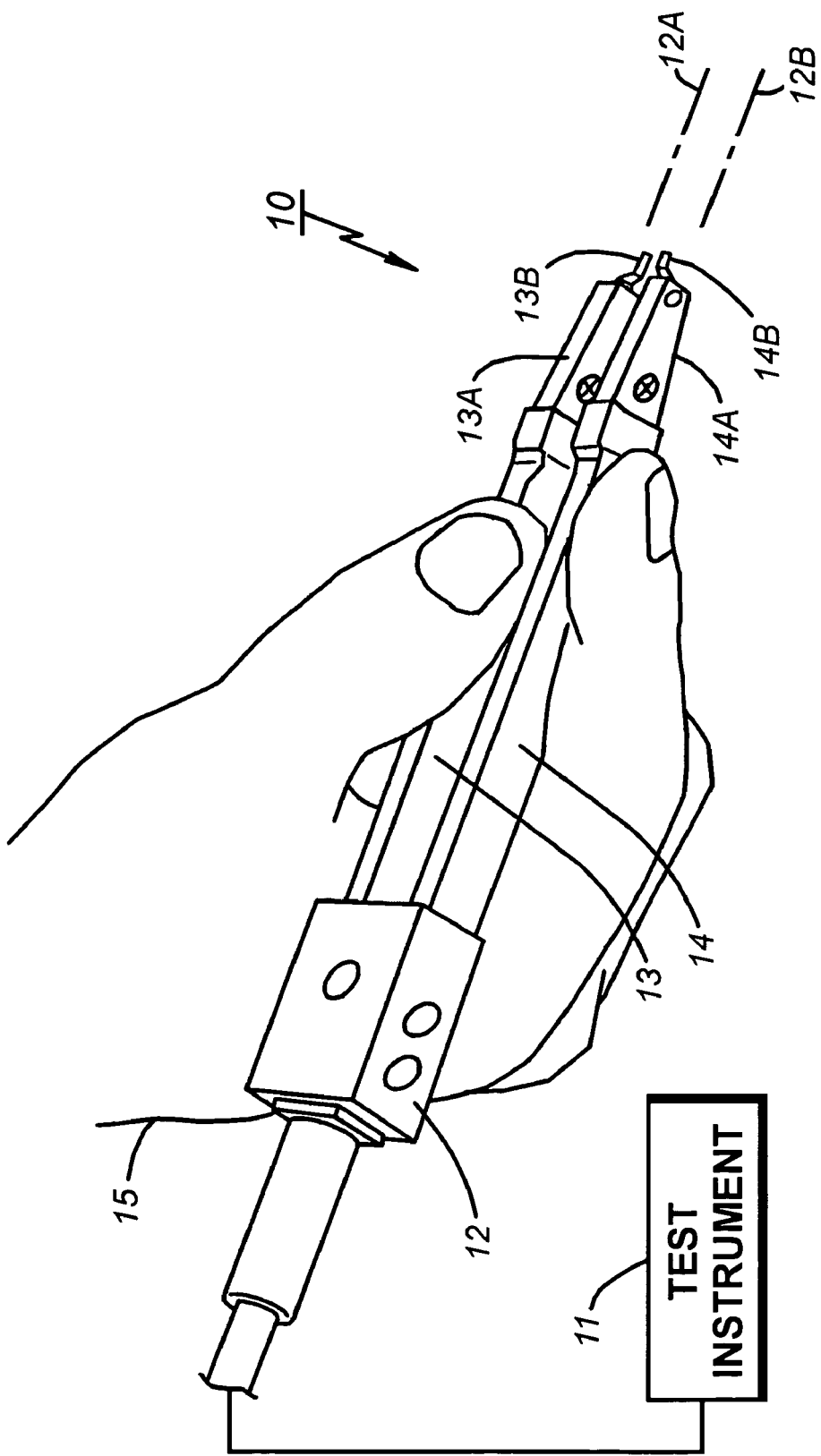
FIG. 1 of the drawings is a perspective view of a tweezers-type electronic test probe constructed according to the prior art.
Figure 2:
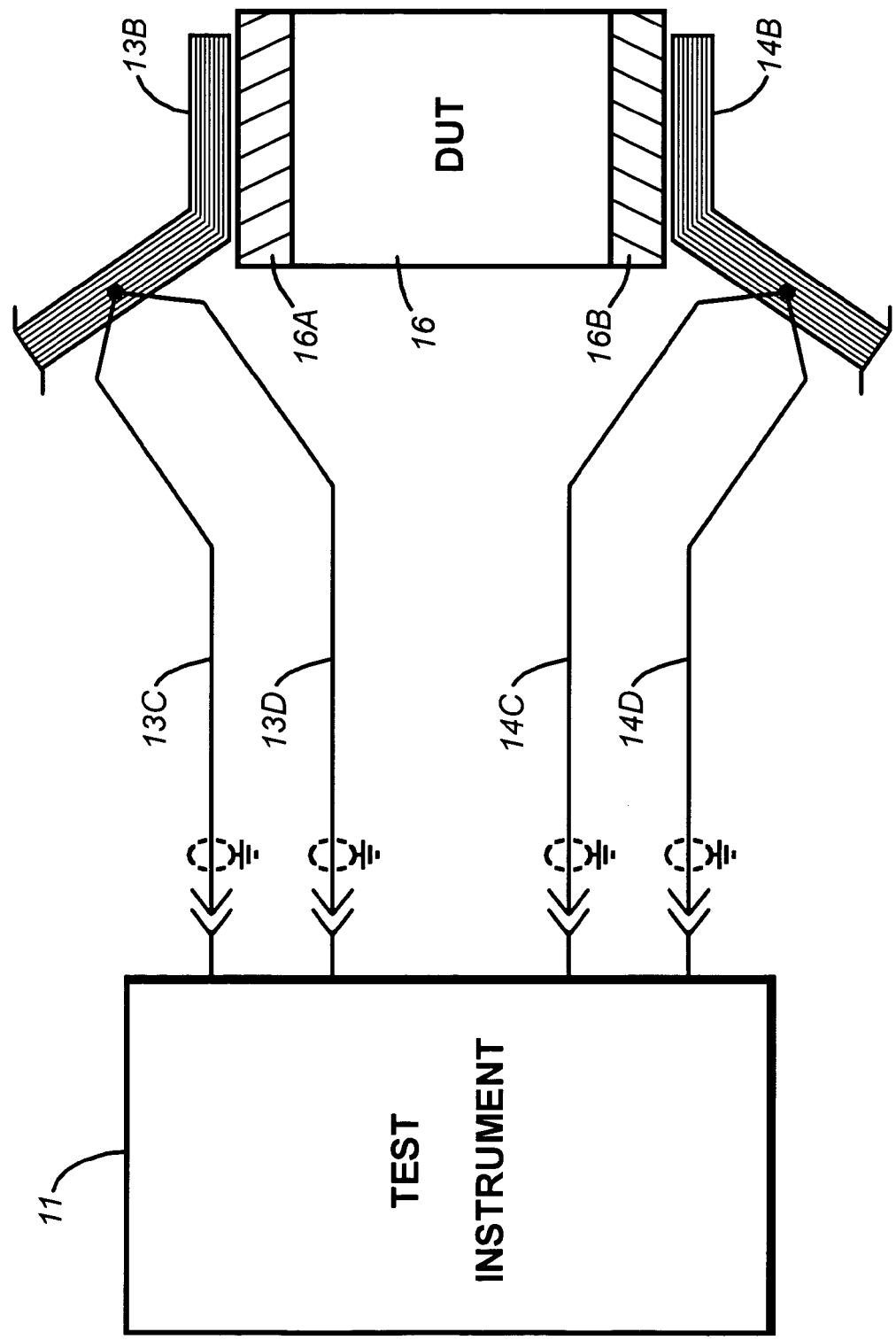
FIG. 2 of the drawings is a circuit diagram showing the electrical connections that the prior art electronic test probe provides between a test instrument and the terminals of a DUT.

FIGS. 1 and 2 of the drawings show various aspects of a tweezers-type electronic test probe 10 constructed according to the prior art. It is connected electrically to an existing form of test instrument 11. Generally, the test probe 10 includes a support component 12 and first and second legs 13 and 14 extending from the support component 12. (FIG. 1). They are "legs" in the sense that each is an elongated member extending distally from the support component 12 along a respective one of axes of elongation 12A and 12B. The first and second legs 13 and 14 include first and second distal portions 13A and 14A and opposing first and second electrodes 13B and 14B on the distal end portions 13A and 14A (FIGS. 1 and 2).

In operation, a user 15 (FIG. 1) grasps the test probe 10 in one hand and squeezes the first and second legs 13 and 14 in order to move the first and second electrodes 13B and 14B toward first and second terminals 16A and 16B of a device under test that is depicted diagrammatically in FIG. 2 as a DUT 16. When that is done, first and second drive and lines 13C and 14C couple respective ones of the first and second electrodes 13B and 14B to known drive circuitry on the instrument 11, while first and second sense lines 13D and 14D couple respective ones of those electrodes to known sense circuitry.

Notice that the first drive line 13C and the first sense line 13D are connected directly to the first terminal 13B, while the second drive line 14C and the second sense line 14D are connected directly to the second terminal 14B. With the drive and sense lines so connected, the foregoing prior art arrangement results in what may be called an abbreviated Kelvin-type test arrangement that disregards the effective serial resistance (ESR) between the first and second test probe electrodes 13B and 14B and the first and second DUT terminals 16A and 16B. That characteristic combines with leg instability, electrode size, and vulnerability to stray serial impedances to significantly degrade test results.

Figure 3:
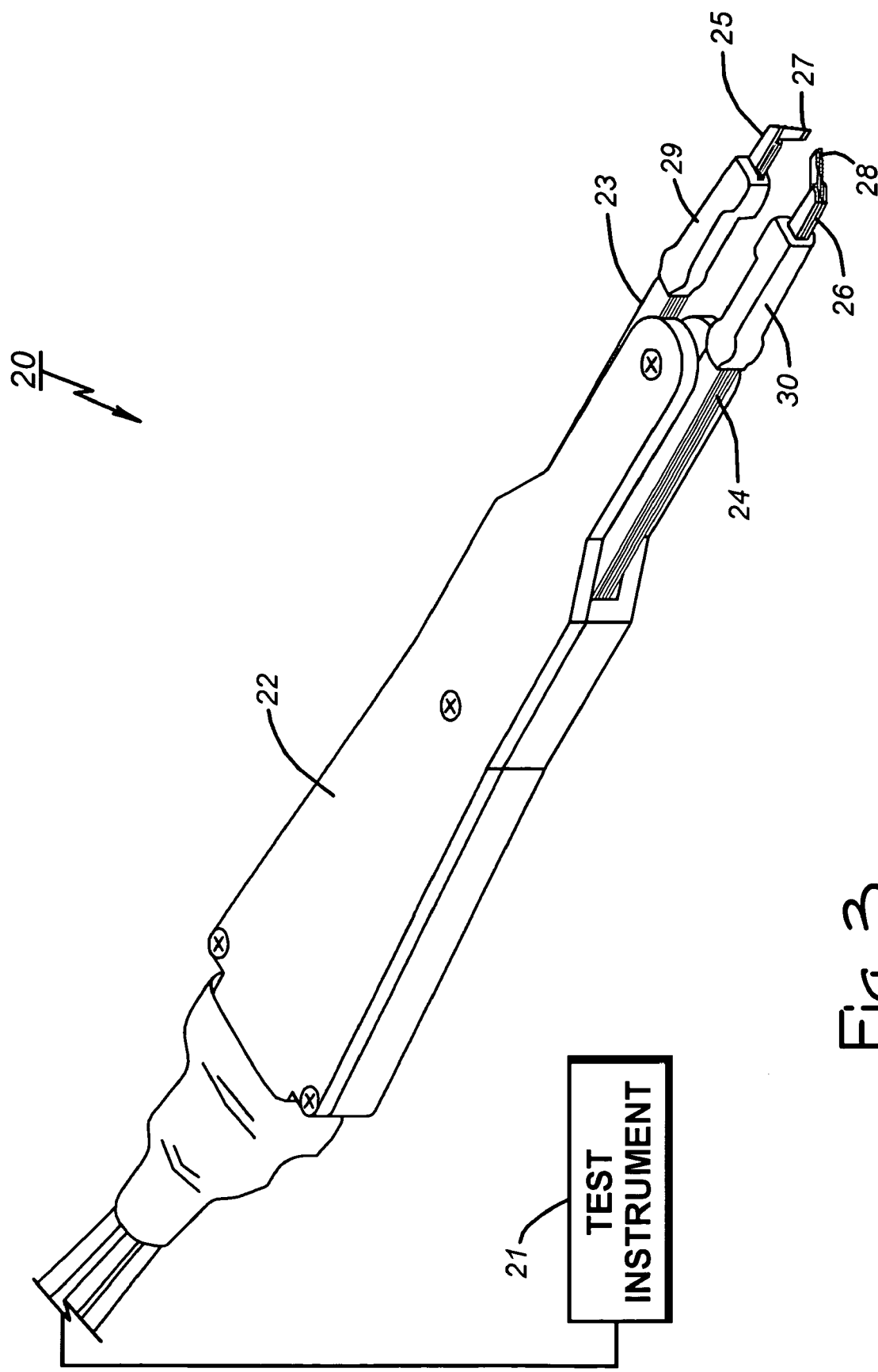
FIG. 3 is a perspective view of a handheld electronic test probe assembly constructed according to the present invention.
Figure 4:
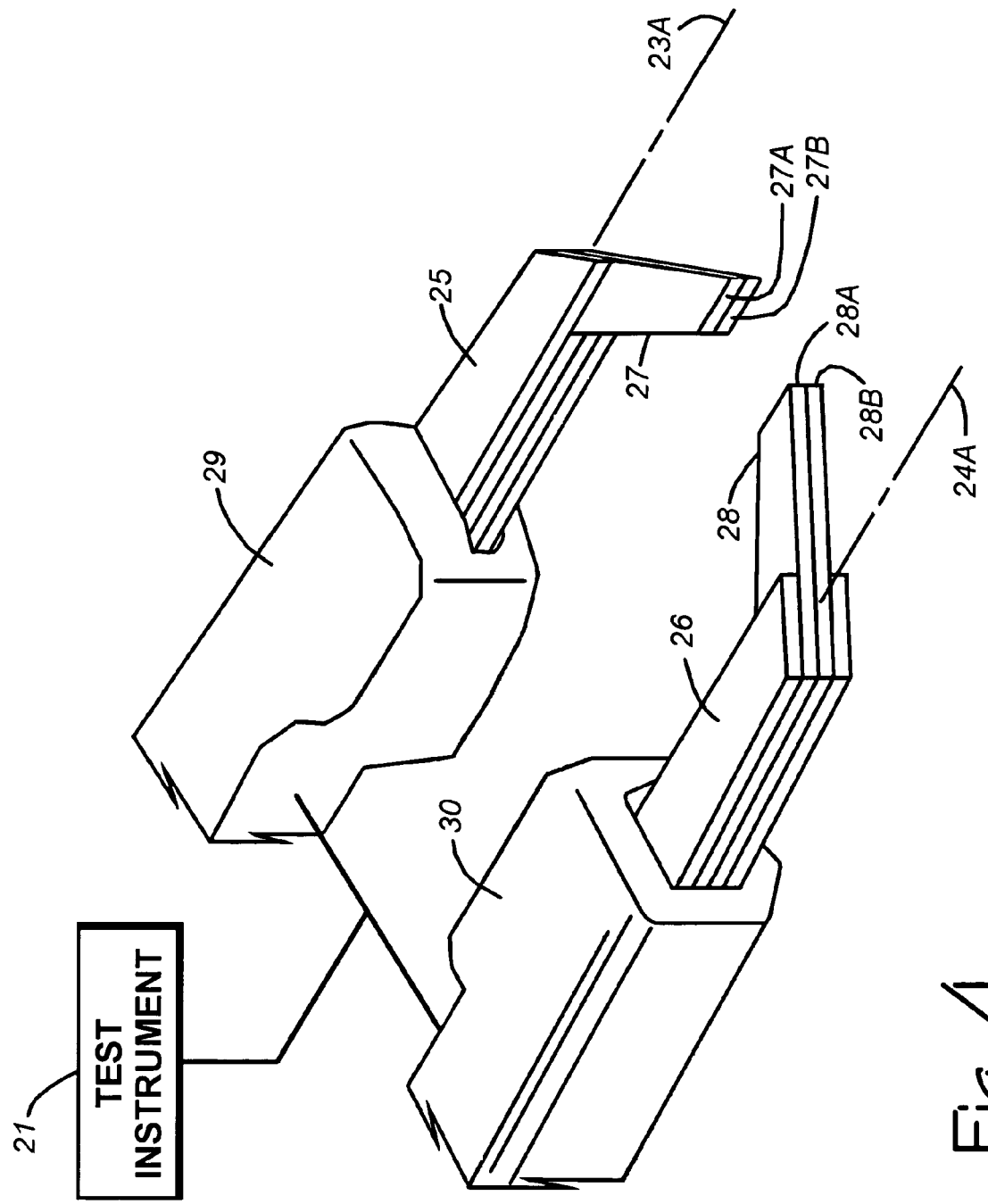
FIG. 4 is an enlarged diagrammatic representation of the distal end portions of the two test probe legs of the handheld electronic test probe assembly shown in FIG. 3.
Figure 5:
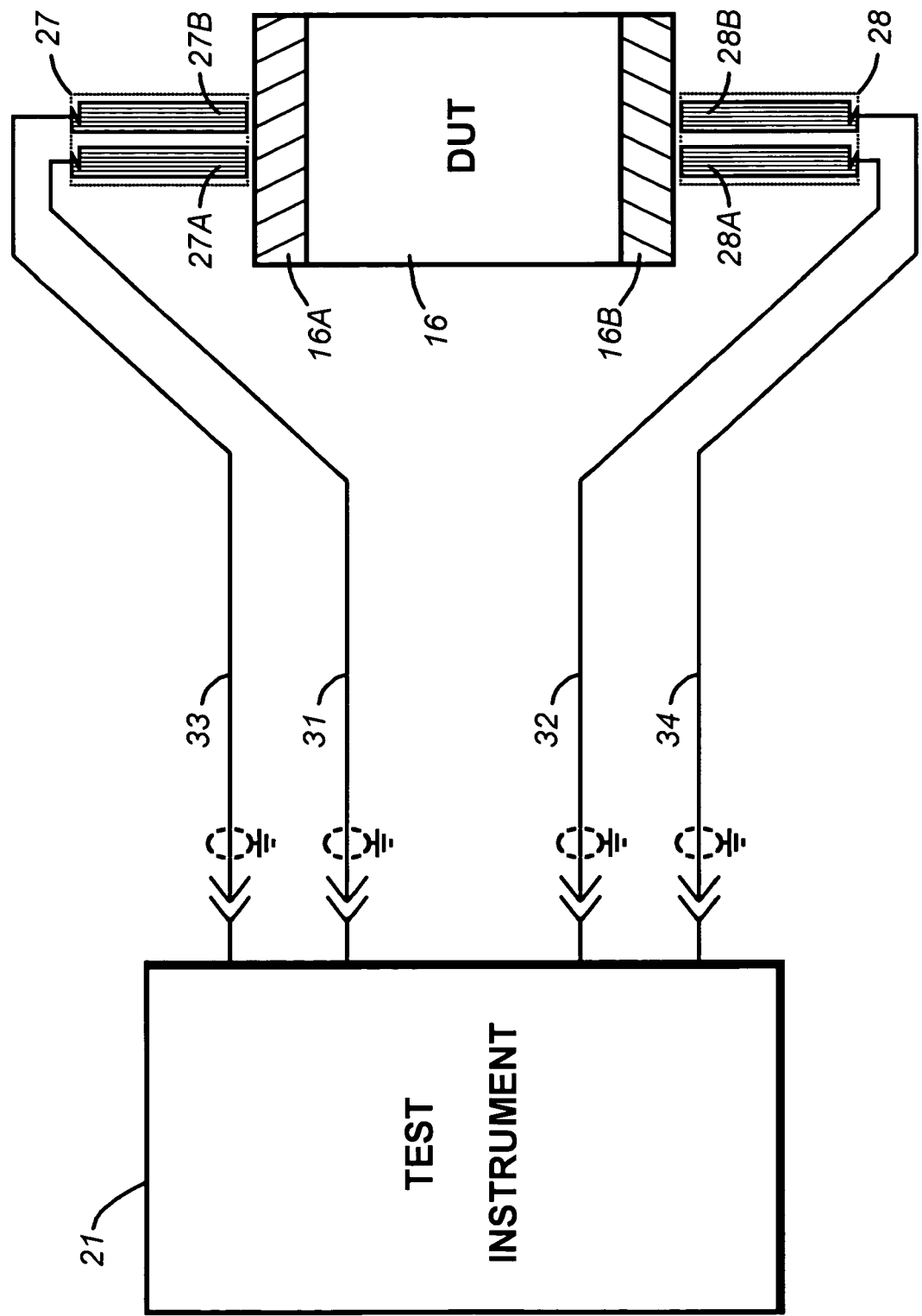
FIG. 5 is a circuit diagram showing the electrical connections the handheld electronic test probe assembly of FIG. 3 provides between the test instrument and the terminals of the DUT.

FIGS. 3, 4, and 5 show various aspects of a handheld electronic test probe assembly 20 constructed according to the instant invention. It is shown in FIGS. 3-5 to be connected to a test instrument 21 (illustrated in block diagram form), a test instrument that may take the form of the known test instrument 11 mentioned previously with reference to FIGS. 1 and 2. Generally, the test probe assembly 20 includes a support component 22 (i.e., a handheld piece a user hold in one hand). It also includes a test probe on the support component 22 (i.e., a combination of components that function as a test probe). The test probe has first and second legs 23 and 24 (i.e., test probe legs) extending from the support component 22 (FIG. 3). They are "legs" in the sense that each is an elongated member extending distally from the support component 22 along a respective one of axes of elongation 23A and 24A (FIG. 4).

Each of the legs 23 and 24 extends from the support component 22 to a respective one of spaced-apart distal end portions 25 and 26 of the legs 23 and 24 (FIGS. 3 and 4). Each of the distal end portions 25 and 26 includes a respective one of opposing first and second terminal-contacting electrodes 27 and 28 (FIGS. 3-5) for contacting terminals on an electronic component to be tested (e.g., the terminals 16A and 16B on the DUT 16). Those terminal-contacting electrodes are also referred to herein as test probe electrodes. Operationally, a user grasps the support component 22 in one hand and squeezes the legs 23 and 24 toward each other in order to move the opposing first and second terminal-contacting electrodes 27 and 28 into contact with the terminals. That is done so that physical contact of the terminals by the electrodes enables the user to lift or otherwise move the component to be tested with the test probe assembly 20, and so that electrical contact of the terminals by the electrodes enables the user to test the component with the test instrument 21.

According to one aspect of the invention, the support component 22 takes the form of a housing that limits contact of the first and second legs 23 and 24, thereby avoiding the test-degrading effect of stray impedances. The housing is described further later on in this specification; it covers at least one-half of the overall length of the test probe components that form the first and second test probe legs 23 and 24. Contact of the legs 23 and 24 is further limited by first and second insulated leg-guarding components 29 and 30 shown in FIGS. 3 and 4 (e.g., leg-covering sleeves composed of a electrically nonconductive material). The user grasps the support component 22 in one hand and squeezes the legs 23 and 24 by bearing against the leg-guarding components 29 and 30 with two fingers of that hand.

According to another aspect of the invention, at least one (and preferably both) of the terminal-contacting electrodes 27 and 28 includes at least two electrically conductive elements for contacting a terminal of a DUT with a multi-point contact (MPC). They are multi-element electrodes. Each of the two electrically conductive elements is moveable to and from the terminal of the DUT independent of the other one of the two elements when the user squeezes the two test probe legs 23 and 24 as described above. This multi-point-contact aspect is illustrated diagrammatically in FIG. 5 by two electrically conductive elements 27A and 27B of the electrode 27 that are contacting the terminal 16A on the DUT 16, and by two electrically conductive elements 28A and 28B of the electrode 28 that are contacting the terminal 16B.

Although multi-element electrodes constructed according to the MPC aspect of the invention may be use for non-Kelvin measurements in order to decrease ESR, FIG. 5 shows them used for Kelvin measurements. The electrically conductive elements 27A and 28A are connected to function as means for coupling a drive signal from the test instrument 21 to the terminals 16A and 16B via two coaxial lines 31 and 32, and the elements 27B and 28B are connected to function as means for coupling a sense signal from the terminals 16A and 16B to the test instrument 21 via another two coaxial lines 33 and 34. A true, four-wire Kelvin test circuit all the way to the surface of the DUT terminals is thereby provided with a test probe assembly that is suitable for most any application where the convenience and speed of a tweezers-type test probe is desired.

Figure 6:
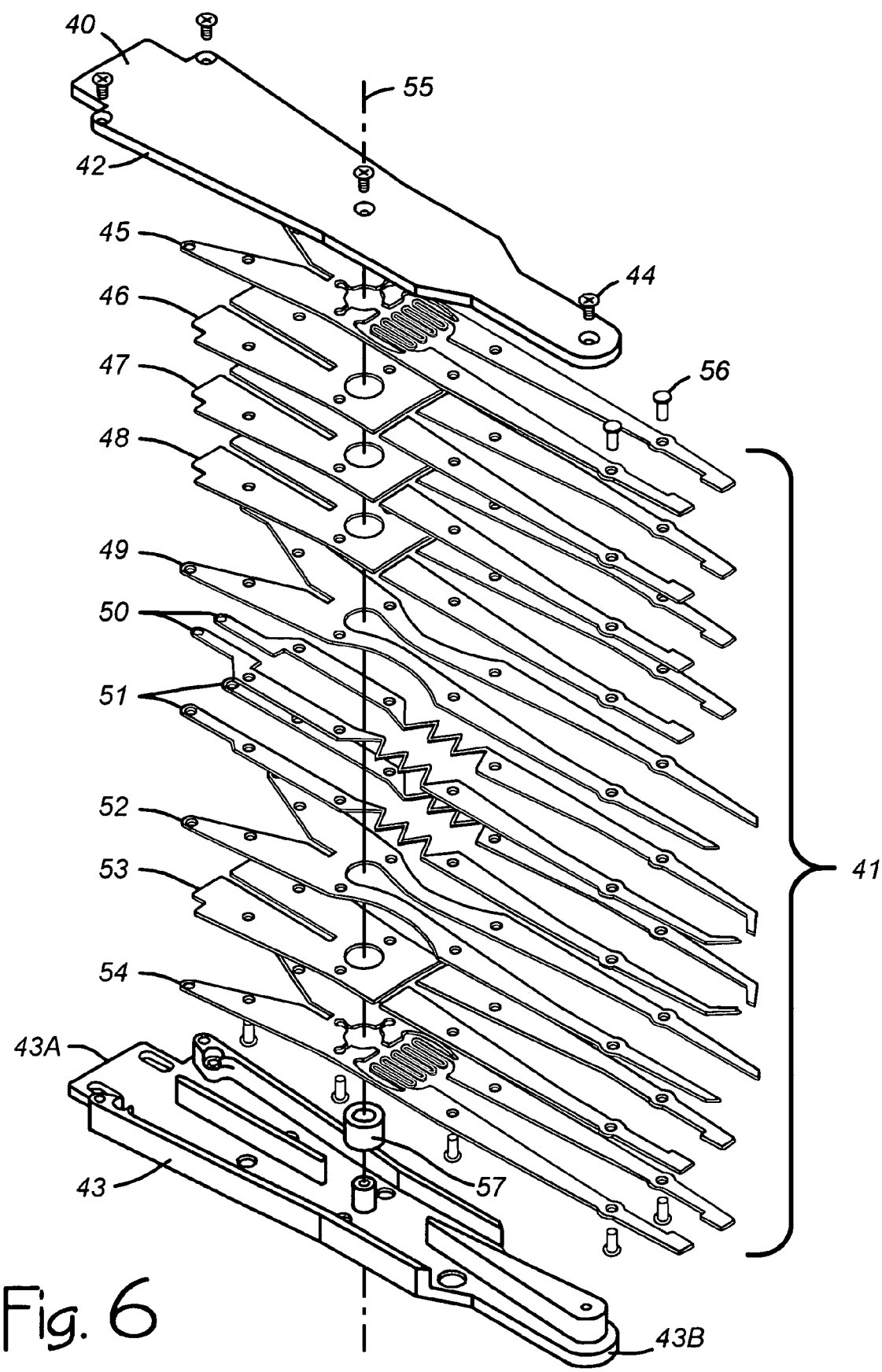
FIG. 6 is an exploded view of the handheld electronic test probe assembly of FIG. 3 showing the housing and the ten test probe layers.

FIG. 6 illustrates further details of the test probe assembly 20. It includes a housing 40 (sections 42 and 43) and a test probe 41 (i.e., a combination of test probe components) disposed partially within the housing 40. The housing 40 includes first and second housing sections 42 and 43 that are preferably composed of an electrically conductive material (e.g., 6061 anodized aluminum) and held together by suitable hardware (e.g., fasteners such as the one fastener 44 identified in FIG. 6). The test probe 41 includes ten layers 45 through 54 that are held together by suitable hardware in desired alignment with a pivotal axis 55 (e.g., fasteners such as the one fastener 56 identified in FIG. 6), while a spacer component 57 helps position the ten layers and maintain the first and second housing sections 42 and 43 properly spaced apart along the pivotal axis 55.

The housing 40 is a support component that function as means for supporting the various parts of the test probe 41. When assembled, its two sections (i.e., the first and second sections 42 and 43) define a handheld piece (i.e., a handle member) having a hollow interior for the various components of the test probe 41. As an idea of size, the illustrated housing 40 is about 135 millimeters (mm) long between the proximal end 43A and the distal end 43B of the second section 43 (FIG. 6), about 32 mm wide at its widest, and about 7.1 mm thick, with the hollow interior measuring about 5.1 mm in depth between the first and second sections 42 and 43 so that the hollow interior can accommodate the ten layers 45 through 54 of the test probe 41. Of course, those dimensions may vary significantly without departing from the inventive concepts disclosed.

Figure 7:
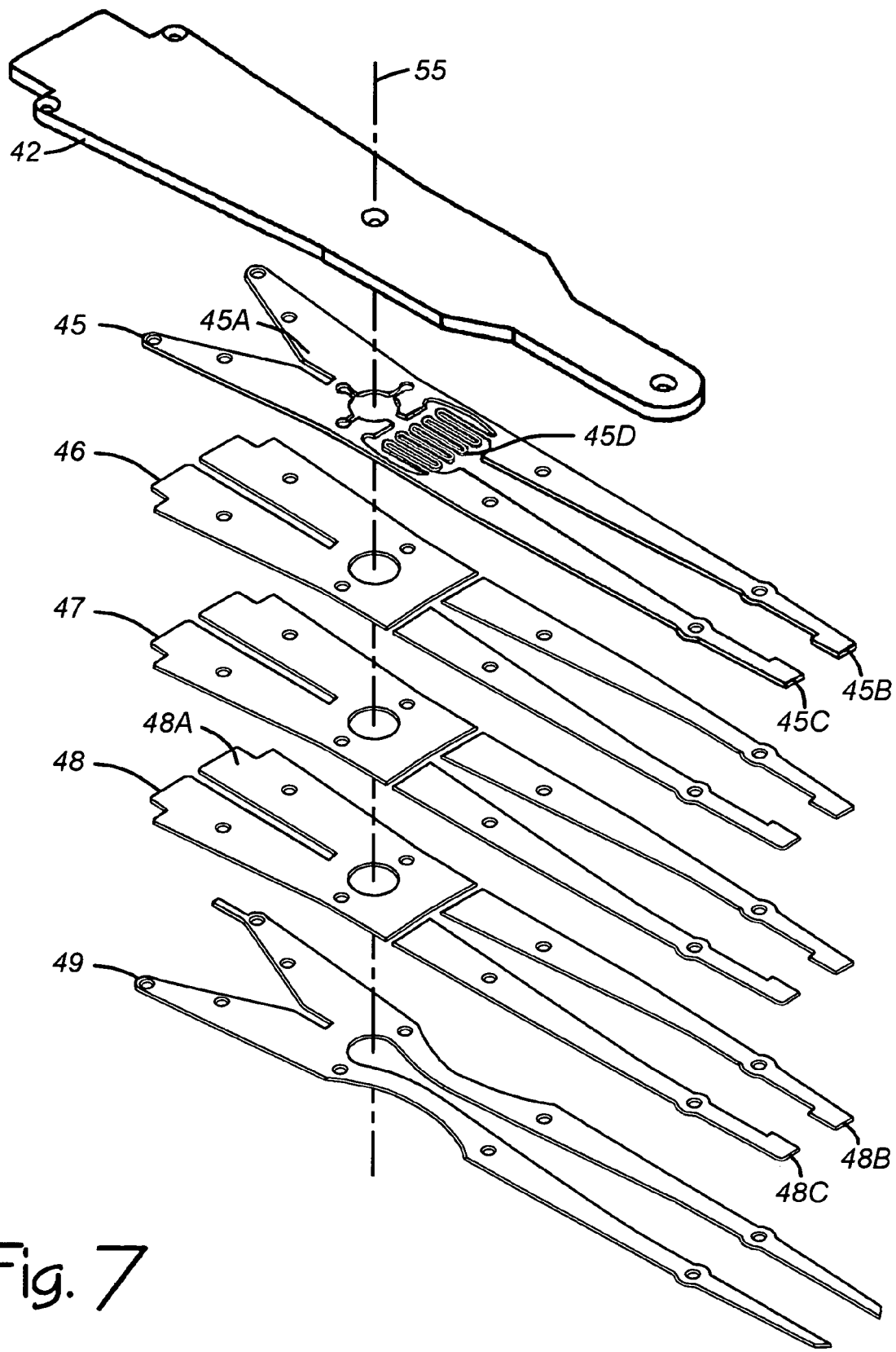
FIG. 7 is an exploded view of just a first six of the ten test probe layers, with the first five layers slightly enlarged and spaced apart for illustrative purposes.
Figure 8:
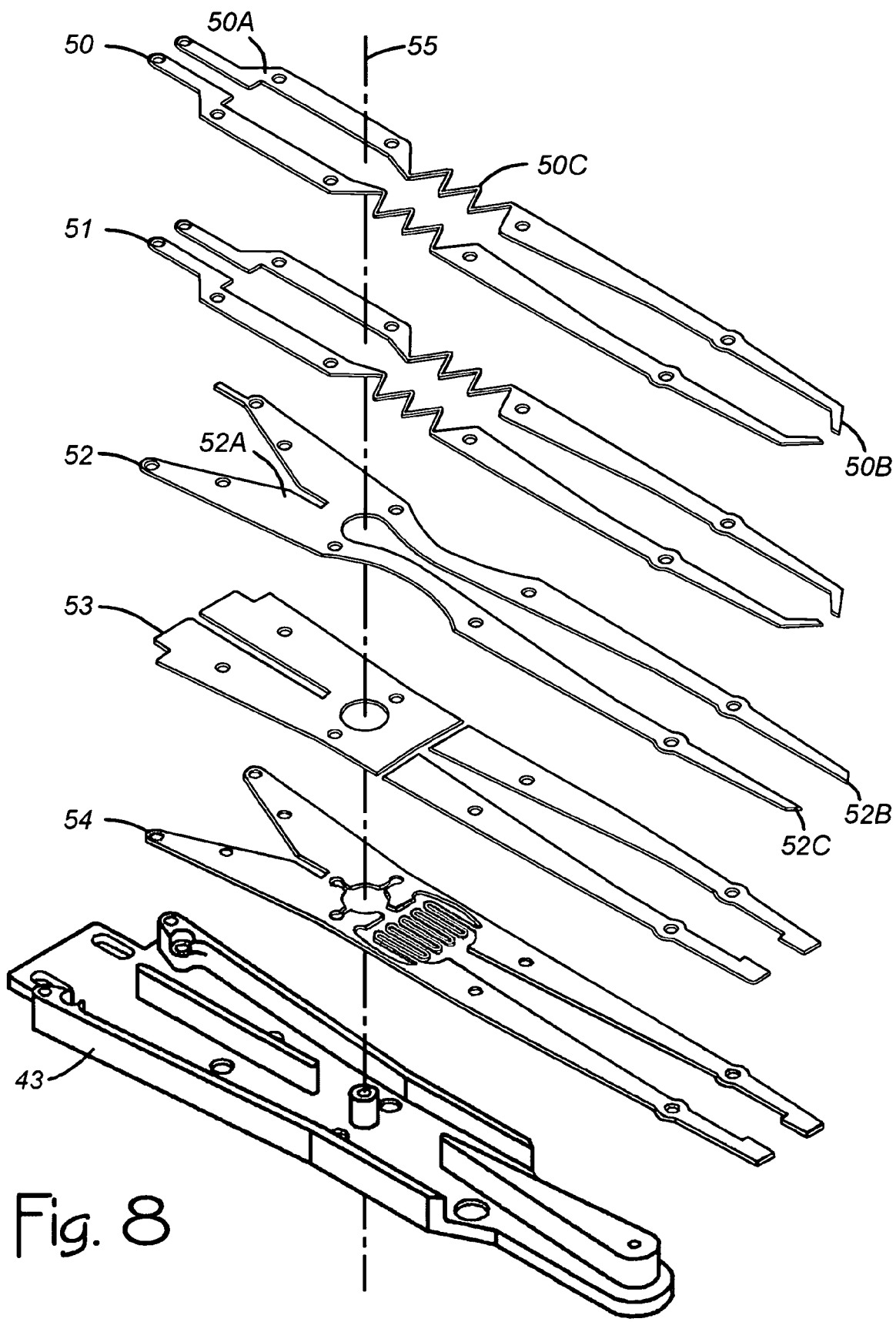
FIG. 8 is an exploded view of a second six of the ten test probe layers, with the second five layers slightly enlarged and spaced apart for illustrative purposes.

For illustrative purposes, the first section 42 of the housing 40 (i.e., the cover) and the first five test probe layers 45 through 49 are illustrated slightly enlarged and spaced apart in FIG. 7, while the second section 43 of the housing 40 (the body) and the second five test probe layers 50 through 54 are illustrated slightly enlarged and spaced apart in FIG. 8. The layer 45 in FIG. 7 is physically and functionally similar to the layer 54 in FIG. 8 and so only the layer 45 of the two is discussed in further detail. In addition, the layers 46, 47, 48, and 53 are physically and functionally similar to each other (only the layer 48 in FIG. 7 being discussed further), the layers 49 and 52 are physically and functionally similar to each other (only the layer 52 in FIG. 8 being discussed further), and the layers 50 and 51 are physically and functionally similar to each other (only the layer 50 in FIG. 8 being discussed further).

Consider the layer 45 in FIG. 7 first. It is referred to herein as a "spring guard" element. Preferably laser-machined from a 0.5 mm thick sheet of electrically conductive material to the illustrated configuration, it includes a proximal end portion 45A, first and second distal end portions 45B and 45C that form parts of the distal end portions 25 and 26 of the first and second legs 23 and 24 covered by the leg-guarding components 29 and 30 discussed previously, and a spring-defining mid portion 45D intermediate the proximal and distal end portions. In use, the spring guard element 45 is connected to a ground potential so that it provides an initial level of guarding (i.e., shielding) of the electrically conductive layers of which the electrically conductive elements 27A, 27B, 28A, and 28B identified previously are a part. The spring guard element 45 also works to spring bias the distal end portions 25 and 26 (and the electrodes 27 and 28) in the open, spaced-apart positions illustrated.

The layer 48 in FIG. 7 is referred to herein as an "insulated spacer" element. It has three, 0.5 mm thick, electrically nonconductive sections, including a proximal portion 48A and first and second distal end portions 48B and 48C. The insulated spacer element 48 functions to insulate the electrically conductive layers 50 and 51 from the spring guard element 45 and the first housing section 42. In addition, it provides spacing to that the total thickness of the stack of layers 45 through 54 (e.g., 5.0 mm) substantially fills the space between the first and second housing sections 42 and 43 (e.g., 5.1 mm).

The layer 52 in FIG. 8 is referred to herein as an "thin guard" element. It is preferably laser-machined from a sheet of copper-clad circuit board material (with the conductive side toward the insulated spacer element 48) to include a proximal section 52A and first and second distal end portions 52B and 52C. The thin guard element 52 provides shielding that extends distally almost as far as do the first and second distal end portions 25 and 26 and the electrodes 27 and 28 of the first and second legs 23 and 24. In the case of a test probe with more than one electrode on a leg, a thin guard element serves to isolate one set of tips from the others.

The layer 50 in FIG. 8 is referred to herein as an "electrode" layer. It includes the two separate electrically conductive elements 27A and 28A that form part of the electrodes 27 and 28 (identified previously with reference to FIGS. 4 and 5), with FIG. 5 showing them connected by drive lines 31 and 32 to the test instrument 21. Each of the electrically conductive elements 27A and 28A is preferably laser-machined from a 0.5 mm thick sheet of electrically conductive material. The element 27A, for example, includes a proximal end portion 50A, a distal end portion 50B that forms part of the electrode 27 (identified previously in FIGS. 3-5), and a spring biasing mid portion 50C that provides a desired spring constant for independent in-use movement of the distal end portion 50B toward and away from a DUT terminal.

Turning now to FIG. 9, it is a top plan view showing the various test probe component layers 45 through 54 in place within the second housing section 43, before the first housing section 42 (the cover) is added and before the leg-guarding components 29 and 30 are assembled at the distal end portions 25 and 26 of the layered test probe legs 23 and 24. Two double-headed arrows near the distal end portions 25 and 26 depict the manner in which the distal end portions move in use. Two double-headed arrows in FIG. 10 depict similar movement of the independently moveable electrically conductive elements of the first and second electrodes 27 and 28 as the electrically conductive elements adjust to DUT-terminal topography.

Second Embodiment

Figure 11:
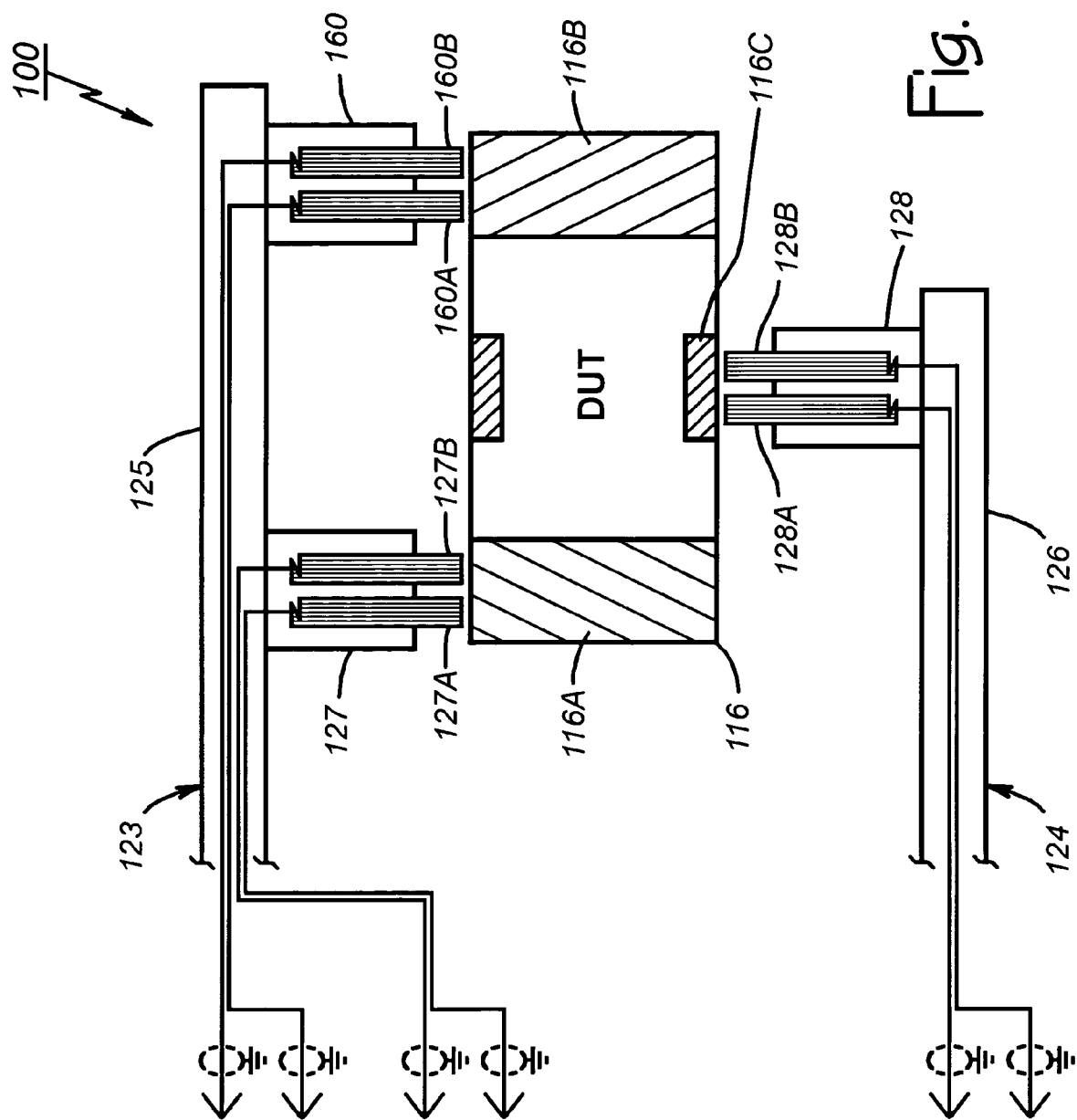
FIG. 11 is a diagrammatic representation of a second embodiment of the invention in the form of a handheld electronic test probe assembly having three electrodes for use in testing a three-terminal DUT.

FIG. 11 shows a test probe assembly 100 that embodies some variations. The test probe assembly 100 is similar to the test probe assembly 20 in many respects and so only major differences are described in greater detail. For convenience, reference numerals designating parts of the test probe assembly 100 are increase by one hundred over those designating similar, corresponding, or related parts of the test probe assembly 20.

Similar in some respects to the test probe assembly 20, the test probe assembly 100 includes first and second layered test probe legs 123 and 124 that extend to first and second distal end portions 125 and 126 of the legs. The major differences is that the test probe assembly 100 includes three electrodes 127, 128, and 160, instead of just the two electrodes 27 and 28 illustrated for the test probe assembly 20. This configuration enables use of the test probe assembly 100 for testing a three-terminal DUT 116 having at least three terminals 116A, 116B, and 116C (as used herein, a three-terminal DUT has three or more terminals). Both the electrode 127 and the electrode 160 are parts of the layered first distal end portion 125 of the first test probe leg 123. The electrode 128 is part of the second distal end portion 126 of the second test probe 124 where it opposes the electrodes 127 and 160.

At least one of the electrodes 127, 128, and 160 includes at least two electrically conductive elements such that each of the two electrically conductive elements is moveable toward and away from the second terminal-contacting electrode independent of the other one of the two electrically conductive elements. Preferably, all three of the electrodes 127, 128, and 160 include at least two such electrically conductive elements. That preferred configuration is illustrated in FIG. 11 by two electrically conductive elements 127A and 127B for the electrode 127, two electrically conductive elements 128A and 128B for the electrode 128, two electrically conductive elements 160A and 160B for the electrode 160.

Thus, the invention provides an electronic test probe assembly that alleviates some drawbacks of existing tweezers-type electronic test probes with features resulting in superior electrical and mechanical performance. Although exemplary embodiments have been shown and described, one of ordinary skill in the art may make many changes, modifications, and substitutions without necessarily departing from the spirit and scope of the invention. As for the specific terminology used to describe the exemplary embodiments, it is not intended to limit the invention; each specific term is intended to include all technical equivalents that operate in a similar manner to accomplish a similar purpose or function.

What is claimed is:

1. A test probe assembly, comprising:
a test probe; and
means for supporting the test probe, said means for supporting the test probe including a probe-supporting housing that a user can hold in one hand;
said test probe being disposed partially within the probe-supporting housing, and said test probe including first and second legs that extend distally from the probe-supporting housing to distal end portions of the first and second legs;
whereby the probe-supporting housing limits contact of the first and second legs by the user when the user holds the probe-supporting housing and squeezes the distal end portions of the first and second legs toward first and second terminals on a DUT;
wherein the distal end portions of the first and second legs include means for contacting terminals on the DUT, including opposing first and second terminal-contacting electrodes;
wherein at least the first terminal-contacting electrode includes at least two electrically conductive elements, each of the two electrically conductive elements being moveable toward and away from the second terminal-contacting electrode independent of the other one of the two electrically conductive elements, thereby facilitating contact of the first terminal on the DUT by both of the two electrically conductive elements; and
wherein the first and second legs are at least partially composed of a plurality of layers and the plurality of layers includes the two electrically conductive elements.

2. A test probe assembly as recited in claim 1, wherein at least one of the two electrically conductive elements includes a first end portion held by the probe-supporting housing, an opposite second end portion extending distally beyond the probe-supporting housing, and a spring-biasing mid portion that interconnects said first and second end portions.

3. A test probe assembly as recited in claim 1, wherein the plurality of layers includes means for guarding an electrically conductive element from stray impedances, said means including at least one electrically conductive guard element.

4. A test probe assembly as recited in claim 1, wherein the plurality of layers includes means for spring biasing the first and second distal end portions of the first and second legs in spaced apart positions, said means including at least one spring element.

5. A test probe assembly as recited in claim 1, wherein the plurality of layers includes means for insulating layers from each other, said means including at least one electrically nonconductive element.

6. A test probe assembly as recited in claim 1, wherein the test probe includes means for contacting three terminals on a three-terminal DUT, said means including three terminal-contacting electrodes on the first and second legs.

7. A test probe assembly as recited in claim 1, wherein the probe-supporting housing at least partially covers at least one-half of the overall length of the test probe disposed partially within the probe-supporting housing.

8. A test probe assembly, comprising:
a test probe; and
means for supporting the test probe, said means for supporting the test probe including a probe-supporting component that a user can hold in one hand;
said test probe being supported by the probe-supporting component, and said test probe including first and second legs that extend distally from the probe-supporting component to distal end portions of the first and second legs;
wherein distal end portions of the first and second legs include means for contacting terminals on the DUT, including opposing first and second terminal-contacting electrodes; and
at least the first terminal-contacting electrode includes at least two electrically conductive elements, each of the two electrically conductive elements being moveable toward and away from the second terminal-contacting electrode independent of the other one of the two electrically conductive elements, thereby facilitating contact of a terminal on the DUT by both of the two electrically conductive elements;
wherein the probe-supporting component takes the form of a probe-supporting housing and the test probe is disposed partially within the probe-supporting housing; and
wherein the first and second legs are at least partially composed of a plurality of layers and the plurality of layers includes the two electrically conductive elements.

9. A test probe assembly as recited in claim 8, wherein at least one of the two electrically conductive elements includes a first end portion held by the probe-supporting housing, an opposite second end portion extending distally beyond the probe-supporting housing, and a spring-biasing mid portion that interconnects said first and second end portions.

10. A test probe assembly as recited in claim 8, wherein the plurality of layers includes means for guarding an electrically conductive element from stray impedances, said means including at least one electrically conductive guard element.

11. A test probe assembly as recited in claim 8, wherein the plurality of layers includes means for spring biasing the first and second distal end portions in spaced apart positions, said means including at least one spring element.

12. A test probe assembly as recited in claim 8, wherein the plurality of layers includes means for insulating layers from each other, said means including at least one electrically nonconductive element.

13. A test probe assembly as recited in claim 8, wherein the test probe includes means for contacting three terminals on a three-terminal DUT, said means including three terminal-contacting electrodes on the first and second legs.

14. A test probe assembly, comprising:
a support component for a user to hold in one hand; and
a plurality of layers held together on the support component, said plurality of layers defining define first and second test-probe legs such that each of the first and second test-probe legs extends distally from the support component to a respective one of spaced apart first and second distal end portions of the first and second test-probe legs;
wherein the support component covers a portion of the plurality of layers in order to limit contact of the plurality of layers by the user when the user holds the support component in one hand and squeezes the distal end portions of the first and second legs toward terminals on a DUT; and
wherein the first and second distal end portions of the first and second test-probe legs include opposing first and second terminal-contacting electrodes such that at least the first terminal-contacting electrode includes at least two electrically conductive elements for contacting one of the terminals on the DUT, each of the two electrically conductive elements being moveable toward and away from the second terminal-contacting electrode independent of the other one of the two electrically conductive elements.

15. A test probe assembly as recited in claim 14, wherein the test probe includes means for contacting three terminals on a three-terminal DUT, said means including three terminal-contacting electrodes on the first and second legs.

16. A test probe assembly as recited in claim 14, wherein the support component at least partially covers at least one-half of the overall length of the test probe.

* * * * *